(12) United States Patent
Peters

(10) Patent No.: US 6,757,440 B2
(45) Date of Patent: Jun. 29, 2004

(54) METHODS AND APPARATUS FOR DATA COMPRESSION

(75) Inventor: Michael Alan Peters, Santa Clara, CA (US)

(73) Assignee: Electronics for Imaging, Inc., Foster City, CA (US)

( * ) Notice: Subject to any disclaimer, the term of this patent is extended or adjusted under 35 U.S.C. 154(b) by 58 days.

(21) Appl. No.: 10/198,505

(22) Filed: Jul. 18, 2002

(65) Prior Publication Data

US 2002/0186891 A1 Dec. 12, 2002

Related U.S. Application Data

(60) Continuation of application No. 09/249,729, filed on Feb. 11, 1999, now Pat. No. 6,449,393, which is a division of application No. 08/878,651, filed on Jun. 19, 1997, now Pat. No. 5,970,174.

(51) Int. Cl.[7] ............................. G06K 9/36; H03M 7/00
(52) U.S. Cl. ........................ 382/247; 382/238; 341/50
(58) Field of Search ............................... 382/238, 232, 382/247, 244, 239; 341/50, 107, 51; 702/181

(56) References Cited

U.S. PATENT DOCUMENTS

| | | | |
|---|---|---|---|
| 4,193,096 A | 3/1980 | Stoffel | 382/238 |
| 5,023,611 A | 6/1991 | Chamzas et al. | 341/151 |
| 5,045,852 A | 9/1991 | Mitchell et al. | 341/51 |
| 5,442,458 A | 8/1995 | Rabbani et al. | 358/426 |
| 5,684,603 A | 11/1997 | Katsuno et al. | 382/252 |
| 5,764,374 A | 6/1998 | Seroussi et al. | 358/427 |
| 5,764,807 A * | 6/1998 | Pearlman et al. | 382/240 |
| 5,861,824 A | 1/1999 | Ryu et al. | 341/50 |
| 5,867,600 A | 2/1999 | Hongu | 382/247 |
| 5,903,676 A | 5/1999 | Wu et al. | 382/244 |

FOREIGN PATENT DOCUMENTS

| | | | |
|---|---|---|---|
| JP | 03-274967 | 12/1991 | H04N/1/41 |
| JP | 5-048912 | 2/1993 | H04N/1/413 |
| JP | 08-065523 | 3/1996 | H04N/1/41 |
| JP | 08-191395 | 7/1996 | H04N/1/411 |

OTHER PUBLICATIONS

Tischer et al., "Context–based Lossless Image Compression," The Computer Journal, vol. 36:1, 1993.
Pennebaker et al., "JPEG Still Image Data Compression Standard," Int'l Thompson Publishing, pp. 135–136, 1993.

* cited by examiner

Primary Examiner—Wenpeng Chen

(57) ABSTRACT

The invention provides for the application of a plurality of compression schemes to data such that improved compression ratios are achieved. A first embodiment provides for compression of each pixel by one of a plurality of different entropy-based compression schemes based upon a probability cost analysis. A second embodiment provides for compression of each pixel based on a hybrid context formed using a plurality of compression schemes for improved probability determination, and thus improved entropy encoding. In embodiments of the invention, a context compression scheme similar to JBIG is applied, as well as an inverse scheme. The context scheme forms a statistical context from a concatenated sequence of previous pixel values. The inverse scheme provides a gray value estimation method based upon previous pixel values and respective threshold values. Statistics are maintained with respect to the actual current pixel value and the difference between an estimated gray value and the current pixel threshold value.

7 Claims, 11 Drawing Sheets if $G_{ij} \geq T_{i\%nTrows, j\%nTcols}$
then $P_{ij} = 1$ otherwise $P_{ij} = 0$ j columns

GRAY ARRAY i rows

|   | 1 | 2 | 3 | 4 | 5 |
|---|---|---|---|---|---|
| 1 | 123 | 120 | 147 | 67 | 95 |
| 2 | 40 | 205 | 234 | 189 | 35 |
| 3 | 250 | 101 | 123 | 158 | 1 |
| 4 | 10 | 82 | 194 | 211 | 201 |

*FIG. 1a*

THRESHOLD ARRAY

|   | 1 | 2 | 3 | 4 | 5 |
|---|---|---|---|---|---|
| 1 | 128 | 230 | 101 | 198 | 205 |
| 2 | 111 | 219 | 197 | 214 | 198 |
| 3 | 154 | 180 | 150 | 140 | 211 |
| 4 | 165 | 127 | 138 | 128 | 200 |

*FIG. 1b*

BILEVEL PIXEL ARRAY

|   | 1 | 2 | 3 | 4 | 5 |
|---|---|---|---|---|---|
| 1 | 0 | 0 | 1 | 0 | 0 |
| 2 | 0 | 0 | 1 | 0 | 0 |
| 3 | 1 | 0 | 0 | 1 | 0 |
| 4 | 0 | 0 | 1 | 1 | 1 |

*FIG. 1c*

GRAY ARRAY

| i rows \ j columns | 1 | 2 | 3 | 4 | 5 |
|---|---|---|---|---|---|
| 1 | 123 | 120 | 147 | 67 | 95 |
| 2 | 40 | 205 | 234 | X | |
| 3 | | | | | |
| 4 | | | | | |

*FIG. 2a*

THRESHOLD ARRAY

| | 1 | 2 | 3 | 4 | 5 |
|---|---|---|---|---|---|
| 1 | 128 | 230 | 101 | 198 | 205 |
| 2 | 111 | 219 | 197 | 214 | 198 |
| 3 | 154 | 180 | 150 | 140 | 211 |
| 4 | 165 | 127 | 138 | 128 | 200 |

*FIG. 2b*

BILEVEL PIXEL ARRAY

| | 1 | 2 | 3 | 4 | 5 |
|---|---|---|---|---|---|
| 1 | 0 | 0 | 1 | 0 | 0 |
| 2 | 0 | 0 | 1 | 0 | 0 |
| 3 | 1 | 1 | 0 | 1 | 0 |
| 4 | 0 | 0 | 1 | 1 | 1 |

*FIG. 2c*

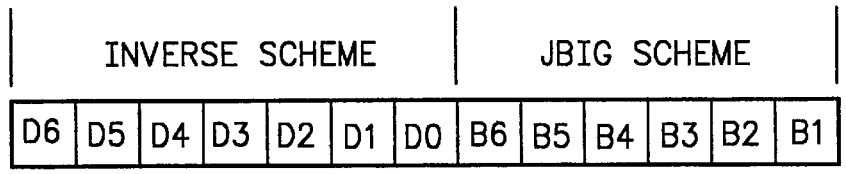
FIG. 8
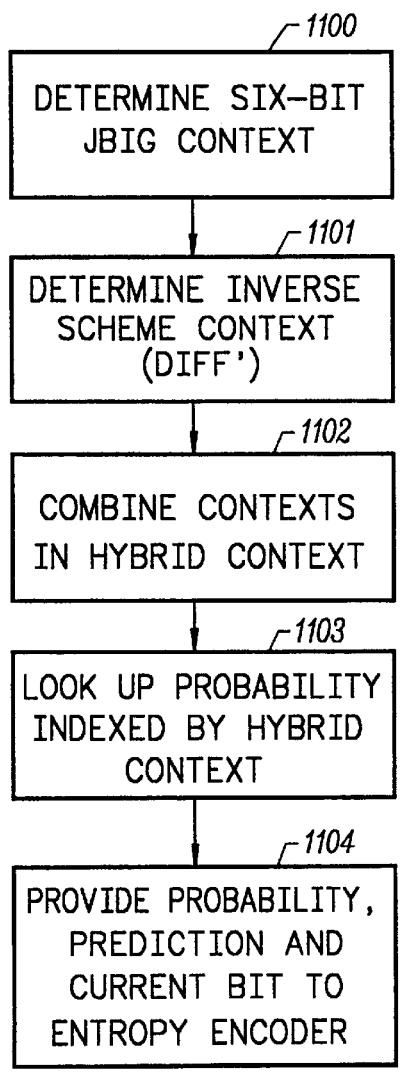
FIG. 9
FIG. 10

METHODS AND APPARATUS FOR DATA COMPRESSION

CROSS-REFERENCE TO RELATED APPLICATIONS

This application is a continuation of U.S. application Ser. No. 09/249,729, now U.S. Pat. No. 6,449,393, filed Feb. 11, 1999 which is a division of U.S. application Ser. No. 08/878,651, now U.S. Pat. No. 5,970,174 filed Jun. 19, 1997.

FIELD OF THE INVENTION

This invention relates to the field of compression and decompression of data.

BACKGROUND ART

Information is represented in a computer system by binary data in the form of 1s and 0s. Binary data are often maintained in a data storage device. In a computer system, data storage is a limited resource. To more efficiently use data storage resources, data are often compressed prior to storage so that less storage area is required. Upon retrieval, the data are decompressed for use. The need for compression can be demonstrated by describing the way that images are represented in a computer system, the transformation of such images into a form suitable for printing, and the storage problems associated with such images. This discussion is followed by descriptions of compression techniques and prior art approaches to compression.

If a person were to look closely at a television screen, computer display, magazine page, etc., he would see that an image is made up of hundreds or thousands of tiny dots, where each dot is a different color. These dots are known as picture elements, or "pixels," when they are on a computer display and as dots when printed on a page. The color of each pixel is represented by a number value. To store an image in a computer memory, the number value of each pixel of the picture is stored. The number value typically represents the color and intensity of the pixel.

The accuracy with which a document can be reproduced depends on the "resolution" of the pixels that make up the document. The resolution of a pixel is determined by the range of the number value used to describe that pixel. The range of the number value is limited by the number of "bits" in the memory available to describe each pixel (a bit is a binary number having a value of one (1) or zero (0)). The greater the number of bits available per pixel, the greater the resolution of the document. For example, when only one bit per pixel is available for storage, only two values are available for the pixel. If two bits are available, four levels of color or intensity are available. While greater resolution is desirable, it can lead to greater use of data storage. For example, if each pixel is represented by a 32-bit binary number, 320,000 bits of information would be required to represent a 100×100 pixel image. Such information is stored in what is referred to as a "Frame Buffer" or gray array ("G array").

A black and white printer has resolution of only one bit per pixel or dot. That is, the printer is only capable of printing a black dot at a location or of leaving the location blank. When an image is to be printed on a black and white printer, the image must be transformed so that its bit resolution matches the bit resolution of the printer. This transformation is known as "thresholding" and consists of determining, for each pixel in the source image, whether the dot to be printed at the corresponding location on the printed page is to be black or white.

Although the printer can only print a black and white image, a printed image can appear to have many different shades of gray depending on the pattern of black and white dots. When every other dot is black, for example, the resulting printed image will appear gray, because the human eye blends the tiny dots together. Many printers are capable of printing 600 dots per inch in the horizontal and vertical directions. Because of the large number of tiny dots, other shades of gray can be simulated by the relative percentage of black and white dots in any region. The more black dots in a region, the darker that region appears.

As noted above, when thresholding, a decision is made for each pixel, based on its original color in the source image, of whether to print a black or white dot on the page for that pixel. Consider a thresholding scheme where each pixel in the stored grayscale image may be represented by 8 bits, for example, giving $2^8=256$ possible values. One thresholding method that does not produce very realistic images is to assign a black value to all image pixels with a value of 128 (out of 256) or above, and a white value to all image pixels with a value of 127 or below. Using thresholding, an entire multi-bit depth frame buffer can be compressed into a one bit per pixel buffer. However, the resulting image is "aliased" (appears like steps or contains jagged edges) and does not approximate the original image. To produce better images, a threshold matrix is generated and used to determine the thresholded value of an image pixel.

A threshold matrix uses different threshold values for an image pixel, depending on the address of the image pixel in the array. Thus, each cell of the frame buffer corresponds to a threshold matrix cell which has an independent threshold level. The threshold matrix need not be the same size and is often smaller than the G array. For example, at one location, an image pixel may be thresholded to black if its value is 128 or above, while an image pixel at another location may be black only if its value is 225 or higher. The result of applying the threshold matrix is an array of ones (1s) and zeros (0s) that could be printed to represent the original continuous tone image.

FIG. 1A depicts a frame buffer (G array), with indices i and j (G[i][j]). FIG. 1B depicts a threshold matrix (T array), with indices i' and j' (T[i'][j']). FIG. 1C depicts the resulting output or pixel array (P array) with i rows and j columns (P[i][j]). Thus, for example, if the pixel maintains a value of 123 ($G_{11}$ of FIG. 1A) and the threshold level is 128 ($T_{11}$ of FIG. 1B), the resulting output value is 0 ($P_{11}$ of FIG. 1C) because the pixel value is less than the threshold level. Hence the resulting pixel array is created by thresholding the G array as follows:

$$P[i][j] = \begin{cases} 1 & \text{if } G[i][j] \geq T[i'][j'] \\ 0 & \text{otherwise} \end{cases}$$

where G[i][j] is an array of the same dimensions as P but takes on many values, typically 0, 1, . . . , 255. T[i'][j'] is a threshold array, a matrix of dimension n threshold rows by m threshold columns and taking on values in a range like G, typically 1, 2, . . . , 255. For the thresholding (i',j') is a function of (i,j) typically:

i'=i modulo n
j'=j modulo m where modulo means the remainder after division.

After this thresholding step, the entire page can be represented in a memory of ones (1s) and zeros (0s) by the same number of bits as there are dots on the page. Even at one bit per dot, the amount of memory required can be substantial.

For a page that is 8.5 by 11 inches and has a resolution of 600 dots per inch (dpi), the amount of memory needed is approximately 4.2 megabytes of memory (if monochrome). Such printer memory is referred to as a "buffer". Memory is an expensive component, and it is advantageous to reduce the amount of memory required in a printer buffer. In the past, this has been accomplished by applying a "compression algorithm" to the data in the buffer. Despite the significant compression which may arise from thresholding, further compression is desired.

There are currently compression schemes for single bit data. Some of these schemes work preferentially better on text data and some work better on image data. Some of these schemes include facsimile standards, such as the ITU standards, using Huffman encoded run lengths and the JBIG (Joint Bi-level Image Group) standard.

There are two distinct families of prior art compression schemes: lossy and lossless. Lossless compression guarantees that no data will be lost upon a compression and decompression sequence. For example, one lossless compression scheme accomplishes this guarantee by searching the data for any repeating sequences such as "001001001001001001". Using this lossless compression scheme, the sequence "001" would be stored along with the number of times it recurs—six. However, lossless compression schemes may not provide a satisfactory level of compression, e.g., due to the absence of repeating sequences in the source data for the above example. Nonetheless, due to its accuracy, lossless compression is used when storing database records, spreadsheets, or word processing files.

A lossy scheme achieves a greater level of compression while risking a loss of a certain amount of accuracy. However, certain types of stored information do not require perfect accuracy, such as graphics images and digitized voice. As a result, lossy compression is often utilized on such types of information.

The most interesting prior art method is set forth in the JBIG standard. Pixels are processed in the usual scan order, i.e., row i is entirely processed before row i+1 and in each row, column i precedes column i+1. Encoding the current pixel uses a context, which comprises a set of nearby pixels that have already been encoded. For example, if ten pixels were used as a neighborhood, there would be $2^{10}$ possible contexts. Based on the frequency with which the current context has been previously encountered, the encoder makes a prediction and estimates the probability that the prediction is accurate. If the estimated probability is reliable and near to certainty, then an arithmetic entropy encoder can losslessly encode the prediction error (e.g., zero (0) for no error, one (1) for error) with much less than one bit per pixel. The decoder has the same context and frequency information, and is therefore able to interpret the zero (0) or one (1) to determine the true value of the pixel.

See also U.S. Pat. No. 5,442,458, issued to Rabbani et al., which is directed to an encoding method for image bitplanes using conditioning contexts based on pixels from the current and previous bitplanes.

SUMMARY OF THE INVENTION

The present invention provides methods and apparatus for compression of data. Whereas the performance of compression schemes of the prior art often depend on the type of data being compressed, the invention provides for the application of a plurality of compression schemes to the data such that improved compression ratios are achieved. A first embodiment provides for compression of each pixel by one of a plurality of different entropy-based compression schemes based upon a probability cost analysis. A second embodiment provides for compression of each pixel based on a hybrid context formed using a plurality of compression schemes for improved probability determination, and thus improved entropy encoding.

The first embodiment of the invention provides a method for choosing the most effective compression scheme per pixel. A multiplicity of compression schemes are utilized and a cost value is associated with each scheme on a pixel by pixel basis. After associating a cost with each scheme, the method selects between the most effective or lowest summed cost scheme on a pixel by pixel basis. The selected scheme provides a predicted value of the current pixel and an estimate of the probability that the prediction is correct. The correctness of the estimate, either true or false, is then encoded by an entropy encoder which uses the estimated probability to encode the true or false outcome in less than one bit, provided that the estimated probability is accurate and not in the vicinity of 0.5. Typically, the estimated probability is greater than 0.95. In a preferred embodiment, the entropy encoding is performed using an arithmetic encoding process.

In one specific embodiment, one of the compression schemes utilized is referred to as the "inverse" scheme. The inverse scheme predicts the gray value of a frame buffer pixel. The scheme examines a set of recently scanned pixels to define a range within which the pixel under consideration is likely to fall. The range is determined as follows.

For each previously scanned pixel, the thresholded value and the associated threshold define a range. For example, if the threshold is 150 and the thresholded value is one (1), the pre-thresholded value is in the range of 150 to 255. If the thresholded value is zero (0), the pre-thresholded value is in the range of 0 to 149. The resulting range is intersected with the similarly determined range from the next closest neighbor pixel.

The intersecting of the threshold matrix ranges continues for each previous neighbor pixel until all pixels have been analyzed or until there is a contradiction, namely that a range is encountered which has no common overlap with the most recently calculated range. A value within the most recently calculated range is then selected as an estimate of the value of the pixel under consideration. The difference between the corresponding threshold value and the estimated value is then calculated. Subsequently, a probability table is updated which records the number of times a binary one (1) or zero (0) resulted with that difference calculation. This probability table is used in the encoding stage.

A second scheme utilized in the specific embodiment above is one similar to that of JBIG, referred to as the "context" scheme. A set of pixels in a frame buffer are selected. Subsequent to the pixel set's thresholding, the thresholded values are concatenated to provide a binary number. A frequency table is maintained which records the number of times a binary one (1) or a binary (0) occurs for each sequence of binary numbers for the pixel set. The concatenated binary number is used as an index into the frequency table, from which the probabilities for use in the encoding stage are derived.

In a second embodiment of the invention, a hybrid context is formed using a first number of bits of the hybrid context to store previous pixel information gathered using a first compression scheme, and using further portions of the hybrid context to store previous pixel information gathered using other compression schemes. Statistics are stored in a table indexed by the hybrid context, and entropy encoding is performed based on the probability information in the table indexed by the hybrid context for the current pixel. The combination of different probability determining schemes results in greater probability values for each pixel, and correspondingly higher compression ratios.

In a further specific embodiment, a thirteen bit hybrid context is formed using seven bits to store a quantized gray value difference determined using the inverse scheme, and using six bits to store recently scanned pixel values in the neighborhood in accordance with the context (JBIG) scheme. A table, indexed by the hybrid context, is formed containing the probability for a given pixel, having the respective six-bit JBIG context and the respective seven-bit gray value difference, to be zero (0) or one (1). An entropy encoder encodes the pixel value based on the prediction and the probability determined from the hybrid context.

BRIEF DESCRIPTION OF THE DRAWINGS

The above-mentioned objects and features of this invention can be more clearly understood from the following detailed description considered in conjunction with the following drawings, in which the same reference numerals denote the same structural elements throughout, and in which:

FIG. 1A is a sample table representing a frame buffer.

FIG. 1B is a sample table representing a threshold matrix.

FIG. 1C is a sample table representing the resulting pixel array from thresholding FIGS. 1A with 1B.

FIG. 2A is a sample table representing a frame buffer with empty cells to be estimated by the present invention.

FIG. 2B is a sample table representing a threshold matrix which is utilized in predicting the empty cells of FIG. 2A.

FIG. 2C is a sample table representing the resulting pixel array which is utilized in predicting the empty cells of FIG. 2A.

FIG. 8 is an illustration of one embodiment of a hybrid context.

FIG. 9 is a flow diagram of an encoding process implementing a hybrid context.

FIG. 10 is a mapping diagram for difference values in one embodiment of the invention.

DETAILED DESCRIPTION OF THE INVENTION

A method and apparatus for compression of data is described. In the following description numerous, specific details, such as the use of the context/JBIG and inverse schemes, are set forth to provide a more thorough understanding of the present invention. It will be apparent, however, to one skilled in the art, that the present invention may be practiced without these specific details. In other instances, well known features have not been described in detail so that the present invention may be clearly described.

Current compression methods are comprised of a modeling and an encoding stage. During the modeling stage, the probability that a pixel value will be a binary one (1) or zero (0) is estimated. During the encoding stage, this probability is utilized to compress or encode the pixels. A disadvantage associated with limiting the compression to one modeling scheme is that some schemes work better on data that were originally text and some work better on data that were originally an image.

The present invention overcomes this disadvantage by applying a plurality of different modeling schemes to each pixel. In one embodiment, the least costly scheme in terms of bits is used to compress the data. In a second embodiment, each scheme is reduced and combined into a single hybrid compression scheme having the advantages associated with each of its constituent schemes.

Figure 4:
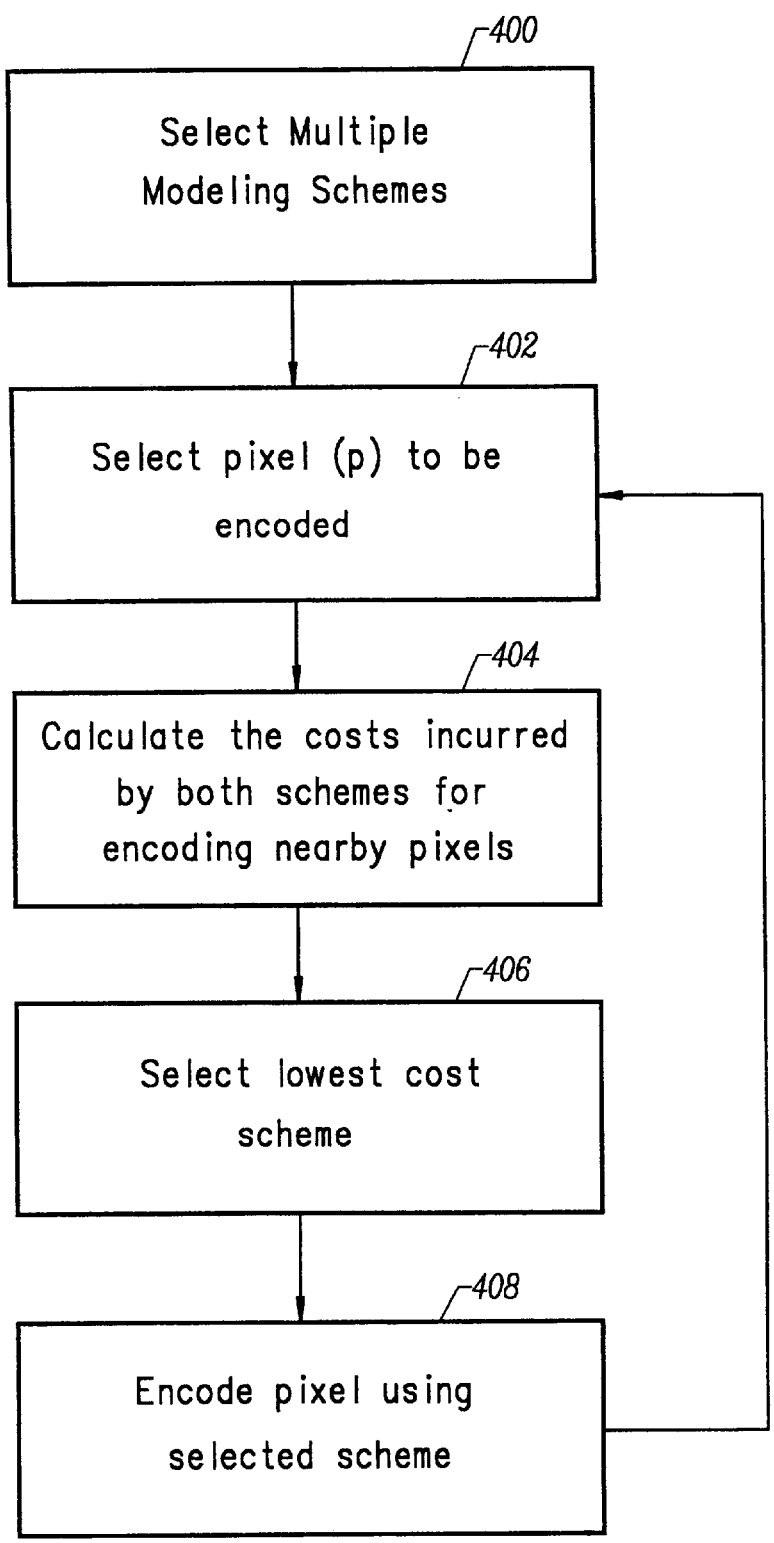
FIG. 4 is a flow diagram demonstrating the switching method of the present invention.

One embodiment of the invention, as illustrated in FIG. 4, provides a method of selectively switching between the most effective compression schemes on a pixel by pixel basis. The first step of the switching method is that of choosing a multiplicity of compression modeling schemes which are going to be used 400. In one embodiment of the invention, a scheme similar to that of JBIG, referred to as the context scheme, is utilized as one of the schemes in the modeling stage, and the "inverse" scheme is utilized as another scheme in the modeling stage.

Prior to selecting a modeling scheme, a cost value is calculated for each scheme 404. Thus, the cost for the context scheme and the cost for the inverse scheme are calculated (see discussion below). The scheme with the lowest summed cost in a pixel neighborhood around the current pixel is selected 406, and the current pixel is encoded using the selected scheme 408. Subsequent to encoding, the next pixel to be encoded is selected, and the process is repeated. Such a calculation of costs and encoding for each pixel permits the most effective or lowest cost scheme to be utilized to encode each pixel independently.

In the above embodiment, the inverse scheme predicts the gray value of a frame buffer pixel. The inverse scheme, which is discussed more fully below, computes a probability that the current pixel is a 0 and a probability that it is a 1, the two probabilities summing to one (1). If either probability is high, i.e., close to one (1), then much less than one bit is required to encode the pixel bit, resulting in compression.

To establish the probability, the inverse scheme predicts the value of the current pixel by examining/analyzing its neighboring pixels. The threshold ranges of the neighboring pixels are intersected until either all of the ranges have been intersected or the ranges cease to intersect. If a neighboring pixel range does not intersect with the previously intersected pixel ranges, the previously intersected pixel ranges are used as the resulting range. A value within the resulting range is selected and differenced with the threshold value for the pixel to be estimated. A table is then created which records the probabilities that the true binary value will be a one (1) or a zero (0) based on the difference value. The probability that a pixel will be a zero (0) or a (1) may be utilized in the encoding stage.

Additionally, in the above embodiment, a scheme similar to that of JBIG, referred to as the "context" scheme, is utilized. A set of pixels in a frame buffer are selected and thresholded. The thresholded values are then concatenated to provide a binary number. A frequency table is compiled which records the number of times a binary one (1) or a binary (0) occurs for each sequence of binary numbers. The concatenated binary number is used as an index into the frequency table. As a result, the frequency table maintains the probabilities which may be utilized in the encoding stage. The values in the frequency table may be scaled down at intervals to reduce the storage requirements of the table.

Though various embodiments are described with reference to a "frequency" table, other means for estimating the probability of the current context may be used to implement an embodiment of the invention. Typically, a numerical value representative of a statistical history of a context is stored, though the extent of the history may vary for different embodiments. The probability value and prediction are determinable from the numerical value representation, but need not be explicitly present in the table. Further, the stored numerical value may be updated (e.g., as a byproduct of an entropy encoding engine) with each context occurrence by increasing or decreasing the respective numerical value based on the current pixel prediction and current actual pixel value.

Inverse Compression Scheme

The inverse scheme is a scheme which estimates the probability during the modeling stage for later use in the encoding stage of the present invention. Referring to FIG. 4, the modeling stage includes steps 400, 402, and 404. The encoding stage includes steps 406 and 408. More specifically, the compression schemes are utilized after the pixel (p) has been selected 402 and before or as part of the calculation of costs 404. The inverse scheme is unique and novel in its approach to estimating the pixel value. The inverse scheme scans the pixel array (P[i][j]) row by row using information from previously scanned pixels and the threshold array to predict the current pixel.

The estimate of the gray value G24 (FIG. 2A) and the threshold value are then used to make a prediction, with a probability, as to the value B24. This is derived from the previous occurrences of the arithmetic difference of the gray estimate and the threshold value.

To perform the estimate, a small set of pixels (S) is utilized, near to P[i][j] that precedes P[i][j] in scan order. Thus, referring to FIG. 5, the first step is the selection of a pixel set 502. In the present example, the scan order is from left to right. Thus, the pixels of FIG. 2C would be scanned in the following order: $P_{11}, P_{12}, P_{13}, P_{14}, P_{15}, P_{21}, P_{22}, \ldots, P_{45}$, where $P_{ij}$ represents i rows and j columns. Referring again to FIG. 2C, the S-set would likely consist of the values scanned prior to the relevant pixel and nearby. The relevant pixel is $P_{24}$ due to the fact that it corresponds to the location in the G-array being estimated (200). Thus, the S-set would contain: $P_{11}$ (0); $P_{12}$ (0); $P_{13}$ (1); $P_{14}$ (0); $P_{15}$ (0); $P_{21}$ (0); $P_{22}$ (0); and $P_{23}$ (1).

For each pixel P[i][j] in the S-set, an estimate of G[i][j] (the value of the pixel prior to thresholding) may be obtained by knowing what value t was used to threshold G[i][j]. In other words, an estimate of $G_{11}$, (of FIG. 2A) may be obtained by knowing that the value 128 (the value at $T_{11}$ of FIG. 2B) was used as the threshold to obtain a binary zero (0) result (the value at $P_{11}$ of FIG. 2C). Similarly, an estimate of $G_{22}$ (of FIG. 2A) may be obtained by knowing that the value 219 (the value at $T_{22}$ of FIG. 2B) was used as the threshold to obtain a binary zero (0) result (the value at $P_{22}$ of FIG. 2C).

Figure 5:
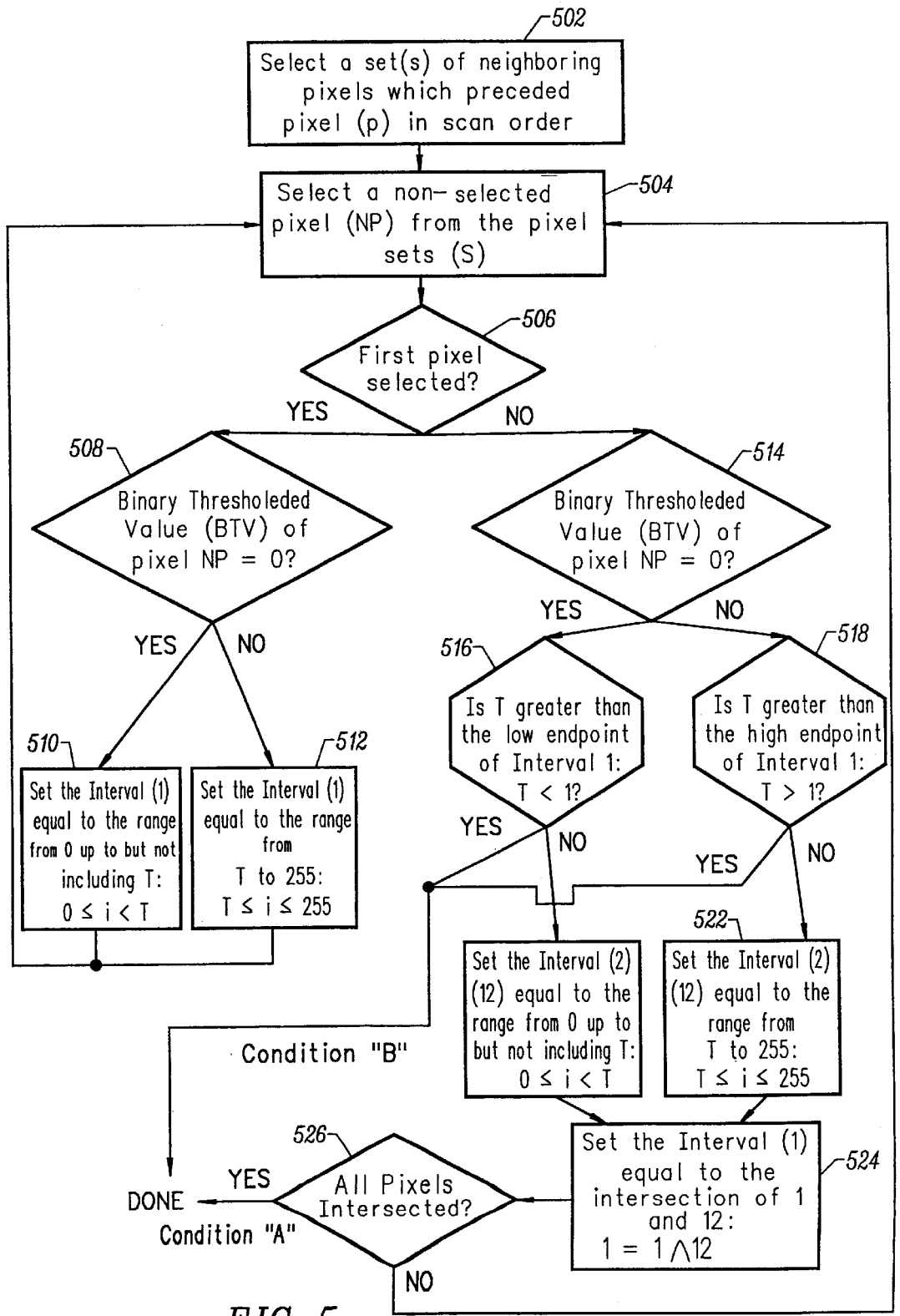
FIG. 5 is a flow diagram demonstrating the inverse scheme.

Referring to FIG. 5, after selecting a set of neighboring pixels 502, a pixel that has not been previously selected (NP) is selected from the pixel set (S) 504. Referring to FIG. 2A, a pixel such as $G_{23}$ would be selected to begin the estimation. If this is the first pixel to be selected 506, then a first interval level must be set. Setting the first interval level consists of first determining whether or not the binary thresholded value (BTV) of the pixel (NP) is equal to zero (0) or one (1) 508. If the binary thresholded value (BTV) is equal to zero (0), then the value of the pixel (NP) may be assumed to be lower than the threshold level 510. Conversely, if the binary thresholded value (BTV) is equal to one (1), then the value of the pixel (NP) may be assumed to be higher than or equal to the threshold level 512. Thus, assuming, as in the preferred embodiment, that the pixel values are made up of 8 bits (256 different values), the minimum value is zero (0) and the maximum value is 255.

The following equations set forth the range of G[i][j] (NP) based on the resulting binary thresholded value (BTV):

$t \leq G[i][j] \leq 255$, if the BTV of $P[i][j]=1$ $0 \leq G[i][j] < t$, if the BTV of $P[i][j]=0$ If the binary thresholded value (BTV) at P[i][j] is equal to one (1), then it may be inferred that the value at G[i][j] is greater than or equal to the t-value which was used in G[i][j]'s (NP's) thresholding. Similarly, if the binary thresholded value (BTV) at P[i][j] is equal to zero (0), then it may be inferred that the value at G[i][j] is less than the t-value which was used in G[i][j]'s thresholding.

For example, if the binary thresholded value (BTV) at P[i][j] was equal to a binary one (1) and the threshold level (T[i'][j']) is equal to 200, then it may be inferred that the value at G[i][j] is equal to or greater than 200. Similarly, if P[i][j] is equal to a binary zero (0) and the threshold value (T[i'][j']) is equal to 200, then it may be inferred that the value at G[i][j] is less than 200. Referring to FIG. 2C, the binary thresholded value (BTV) at $P_{13}$ is one (1). The value which was used as a threshold was 101 (the value at $T_{13}$ of FIG. 2B). As a result, it can be estimated that the value of $G_{13}$ (NP) of FIG. 2A is greater than or equal to 101. Similarly, the binary thresholded value of $P_{22}$ (of FIG. 2C) is zero (0). The value which was used as a threshold for $P_{22}$ was 219 (the value at $T_{22}$ of FIG. 2B). Consequently, it may be inferred that the value at G22 (NP) is less than 219. Although the above examples of FIG. 2 demonstrate that the values of $G_{13}$ and $G_{22}$ are already known (147 and 205 respectively), to utilize the inverse scheme of the present invention, estimates of all pixels in an S-set must be performed.

Based on the estimates of the surrounding pixels, the inverse scheme estimates the desired value at G[i][j] (200). To make the estimation of X at G[i][j] (200), the intervals for each of the pixels in S are intersected. Hence, referring again to FIG. 5, subsequent to the first pixel 506, the intervals associated with the remaining pixels (NP) in the pixels set (S) are intersected. The intersections are performed sequentially in order of proximity to pixel p. Thus, the intervals associated with the pixels from the S set are intersected one at a time beginning with the pixel closest to pixel p. Referring to FIG. 2A, if pixel X 200 is the pixel to be estimated and the first pixel to be analyzed is that of $G_{23}$ (with a value of 234), the next pixel that would have been scanned is that of $G_{22}$ (with a value of 205). The next pixel that would have been scanned is that of $G_{21}$, then $G_{15}$, etc.

Referring again to FIG. 5, the first step of intersecting is that of determining the binary thresholded value of the pixel that is currently being analyzed and intersected 514. If the binary thresholded value is zero (0), then once again, it is known that the value prior to thresholding was less than the threshold value (T). Hence, the maximum value of the pixel (NP) would be that of one less than the threshold value. For example, the binary thresholded value of $P_{22}$ (NP) (of FIG. 2C) is zero (0). The value which was used as a threshold for $P_{22}$ was 219 (the value at $T_{22}$ of FIG. 2B). Consequently, it may be inferred that the value at $G_{22}$ (NP) is less than 219 or the maximum value of NP is one less than 219 or 218. Hence, NP has a range of from zero (0) to 218.

Similarly, if the binary thresholded value is equal to one (1), then once again, it is known that the value prior to thresholding was greater than or equal to the threshold value (T). Hence, the minimum value of the pixel (NP) would be that of the threshold value. For example, referring to FIG. 2C, the binary thresholded value (BTV) at $P_{13}$ is one (1). The value which was used as a threshold was 101 (the value at T13 of FIG. 2B). As a result, it can be estimated that the value of $G_{13}$ (NP) of FIG. 2A is greater than or equal to 101. Hence, the minimum value of the pixel (NP) would be that of 101.

If the intersection of the intervals as already determined does not intersect with the current NP's range, the process stops. As a result, it must be determined if an intersection will occur at all (steps 516 and 518 of FIG. 5). If the existing interval level is greater than the threshold level, and the binary thresholded level was a zero (0), then the ranges do not intersect 516. For example, if the BTV is zero (0), the existing interval level is from 210 to 255, and the threshold level is a 200, then the ranges 0–199 and 210–255 do not intersect. As such, the process stops without including the current NP's range in the intersection.

Similarly, if the existing interval is less than the threshold level, and the binary thresholded level was a one (1), then the ranges do not intersect 518. For example, if the BTV is one (1), the existing interval level is from zero (0) to 150, and the threshold level is a 200, then the ranges 0–150 and 200–255 do not intersect. As such the process stops. On the other hand, assuming that an intersection will occur, then the existing interval level is updated, restricting the interval to the range of the intersection (Steps 520, 522, and 524 of FIG. 5). For example, if the range for some pixel A (a pixel in closest proximity to pixel p) was greater than or equal to 200 (200–255), and the range for some other pixel B (the pixel in next closest proximity to pixel p) was less than 210 (0–210), the intersection of the two intervals is from 200 to 210.

The intersection of the ranges in close proximity to pixel p then continues. Continuing with the above example, the intersection 200–210 would then be intersected with the next previous pixel in the scan. Referring to FIG. 2, assuming that the S-set consists of the nearest 7 pixels as discussed supra, to estimate the value of X 200, the intervals for the pixels in the S-set (those in closest proximity to X) are estimated and intersected. Thus, the first pixel to be estimated is that of $G_{23}$. To estimate what $G_{23}$ would be, its binary thresholded value (BTV) and its threshold value are examined. The binary thresholded value (BTV) of $P_{23}$ is one (1) and the threshold value is 197. Thus, it may be estimated that $G_{23}$ must be greater than or equal to 197. Because the pixels in FIG. 2 are made up of 8 bits, the maximum value is 255. Hence, the interval for $G_{23}$ is from 197–255.

The next pixel in closest proximity is that of $G_{22}$. The binary thresholded value (BTV) of $P_{22}$ is zero (0) and the corresponding threshold level at $T_{22}$ is 219. Therefore, the estimated value for $G_{22}$ must be lower than 219. The intersection of the intervals from $G_{23}$ and $G_{22}$ is then calculated. $G_{22}$ ranges from 0 to 218 and $G_{23}$ ranges from 197–255. Therefore, the intersection must be lower than 218 but higher than 197. Such an intersection results in an interval from 197–218. This process is then repeated with the next pixel in the closest proximity to X 200.

The intersection of the intervals continues until one of two conditions has been met. The first condition occurs when all of the intersects of pixels in the S-set have been intersected ("Condition A") (526). The second condition occurs when the intersection results in an empty set (i.e. the threshold intervals did not intersect) ("Condition B") (516 and 518), in which case the previous non-empty intersection is examined.

Continuing with the example above, the next closest pixel is that of $G_{21}$. The binary thresholded value (BTV) at $P_{21}$ is zero (0) and the threshold level at $T_{21}$ is 111. Thus, the value of $G_{21}$ must be less than 111. The intersection of this interval with the above interval (197–218) results in a set which is between zero (0) and 111 and also between 197–218. Due to the fact that no such value exists, the two intervals do not intersect resulting in a "contradiction". As a result, "Condition B" has been met (the threshold intervals did not intersect). The intersection of the intervals process comes to a halt. The last intersection which maintained a value is preserved (197–218).

Figure 6:
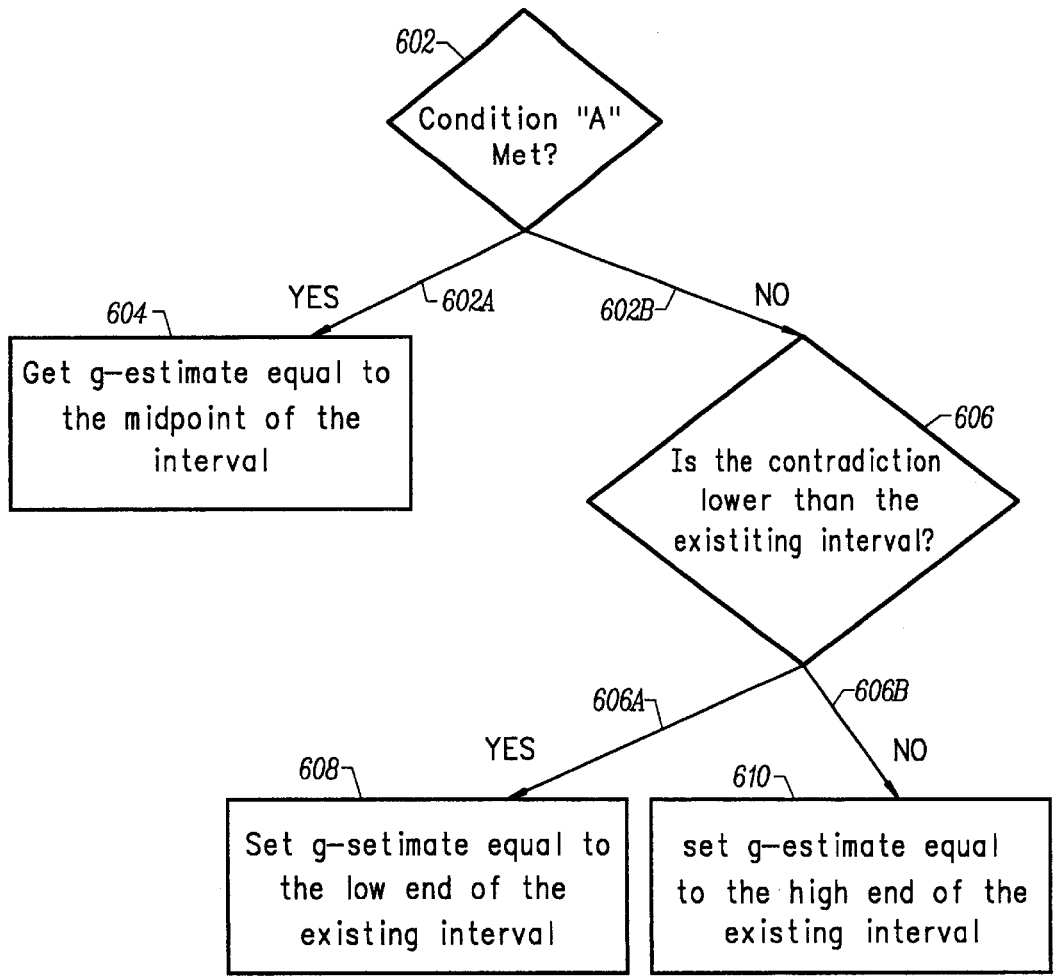
FIG. 6 is a flow diagram demonstrating the process of calculating the g-estimate of an interval.

From the resulting intersection interval, a value is estimated (g-estimate) and selected for G[i][j] (pixel p). Referring to FIG. 6, if "Condition A" has been met 602A, then the midpoint of the resulting intersection is used as the g-estimate 604. Thus, if all pixels are intersected, condition A is met and the midpoint is used. In the above example, if no contradiction had resulted and all of the pixel intervals had been intersected, the midpoint between 197 and 218 (the value 208) would be used as the g-estimate. If "Condition B" has been met 602B, then the value closest to the contradiction is utilized (Steps 606, 608, and 610). Thus, if pixel intervals do not intersect, condition B is met and an endpoint is used.

In the above example, the resulting intersection interval is from 197–218. Further, the contradiction and halting arose with a value of 111 (Step 606A of FIG. 6). Therefore, the value closest to the contradiction, yet still within the interval is that of 197, which is then used as the g-estimate 608. If the contradiction had occurred with a non intersecting interval of 230–255 (Step 606B of FIG. 6), then the endpoint of 218 would be used as the g-estimate because it is the closest value to the contradiction (230) (Step 610 of FIG. 6).

The first step in estimating the current pixel probability is obtaining or computing a difference value. The difference value (diff) is the difference between the g-estimate for pixel p and the threshold value (T) for pixel p. Thus, diff equals the g-estimate minus T[i'][j'] where T[i'][j'] is the threshold value for the pixel at P[i][j]:

diff=g-estimate−T[i'][j']

Once again continuing with the above example, the value 197 is the g-estimate. Diff is therefore equal to 197−T[i'][j']. T[i'][j'] in the present example is equal to 214 (the value at T24 220). Thus, diff is equal to 197−214 or −17.

The value of diff is used as the context for obtaining an estimated probability from a table comprising statistical history information for each context. For eight-bit g-estimates and threshold values, diff may retain values in the range: −255, −254, . . . , 253, 254.

(g values in 0, 1, . . . 255 t values in 1, . . . , 255)

The current pixel bit value and the associated diff value context may be used to update the statistical information in the table.

In one embodiment, statistics are maintained on the approximate number of times previously for each diff value that P[i][j] has resulted in a binary zero (0) after thresholding and the number of times P[i][j] has resulted in a binary one (1) after thresholding. Thus, a table indexed by the diff value context may be created which maintains approximate statistical information gathered over a number of past pixels.

For example, if for seven out of 10 times when the diff value was a −4, $P_{12}$ was a zero (0), and for three out of those ten times $P_{12}$ was a one (1), such frequencies/statistics or approximations thereof would be recorded. Based on this frequency, $prob_1$ may be estimated. $Prob_1$ is equal to the estimated probability that the pixel is a binary one (1). Therefore, as in the above example, if for the last three out of ten times when the diff value was a −4, $prob_1$ would retain the value of approximately 3/10 or 0.3. $Prob_0$ is equal to the estimated probability that the pixel is a binary zero (0). Similarly, if for the seven of the last ten times when the diff value was a −4, $P_{12}$ was a 0, $prob_0$ would retain the value of approximately 7/10 or 0.7. It should be noted that the total of the probabilities is one (1):

$prob_0 + prob_1 = 1$

7/10 + 3/10 = 1.

Thus, both probabilities need not be estimated in all embodiments, as one probability may be determined from the other.

As previously stated, the "frequency" table implementation for estimating probabilities is one example of how probability information may be determined for each context. Other methods for estimating the probability associated with each diff value context may also be used within the scope of the invention.

Context Compression Scheme

Figure 3:
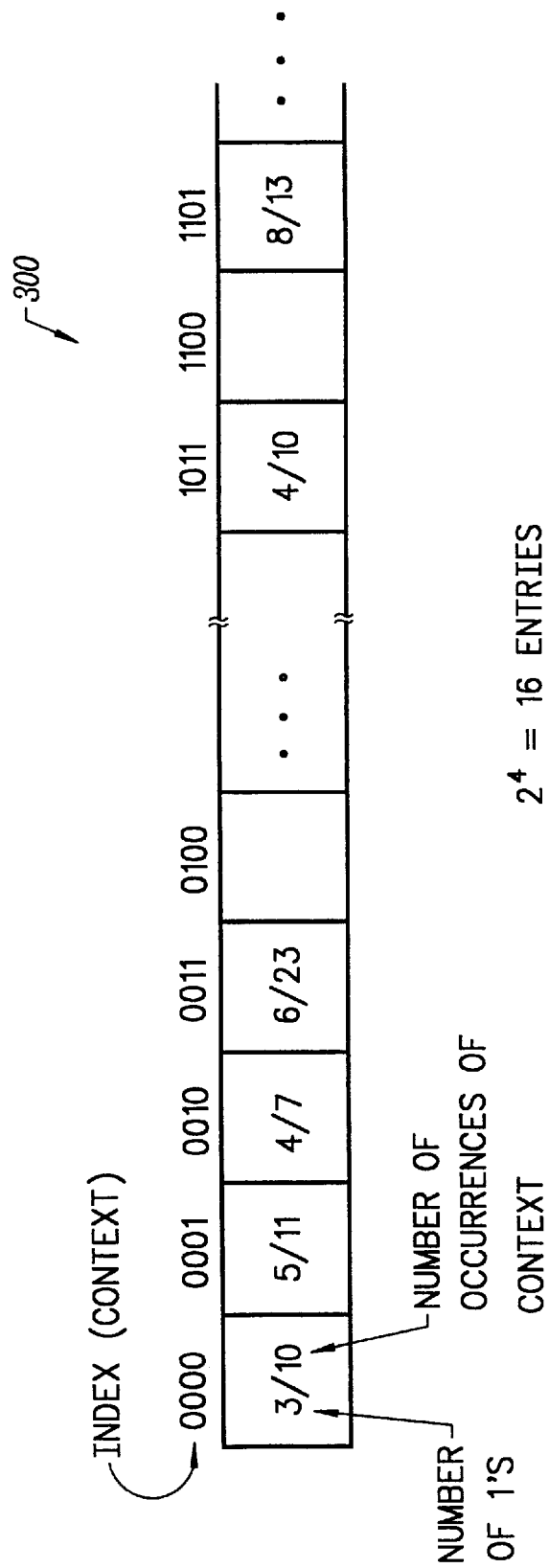
FIG. 3 is a sample probability table which is utilized in the context scheme to maintain statistics.
Figure 7:
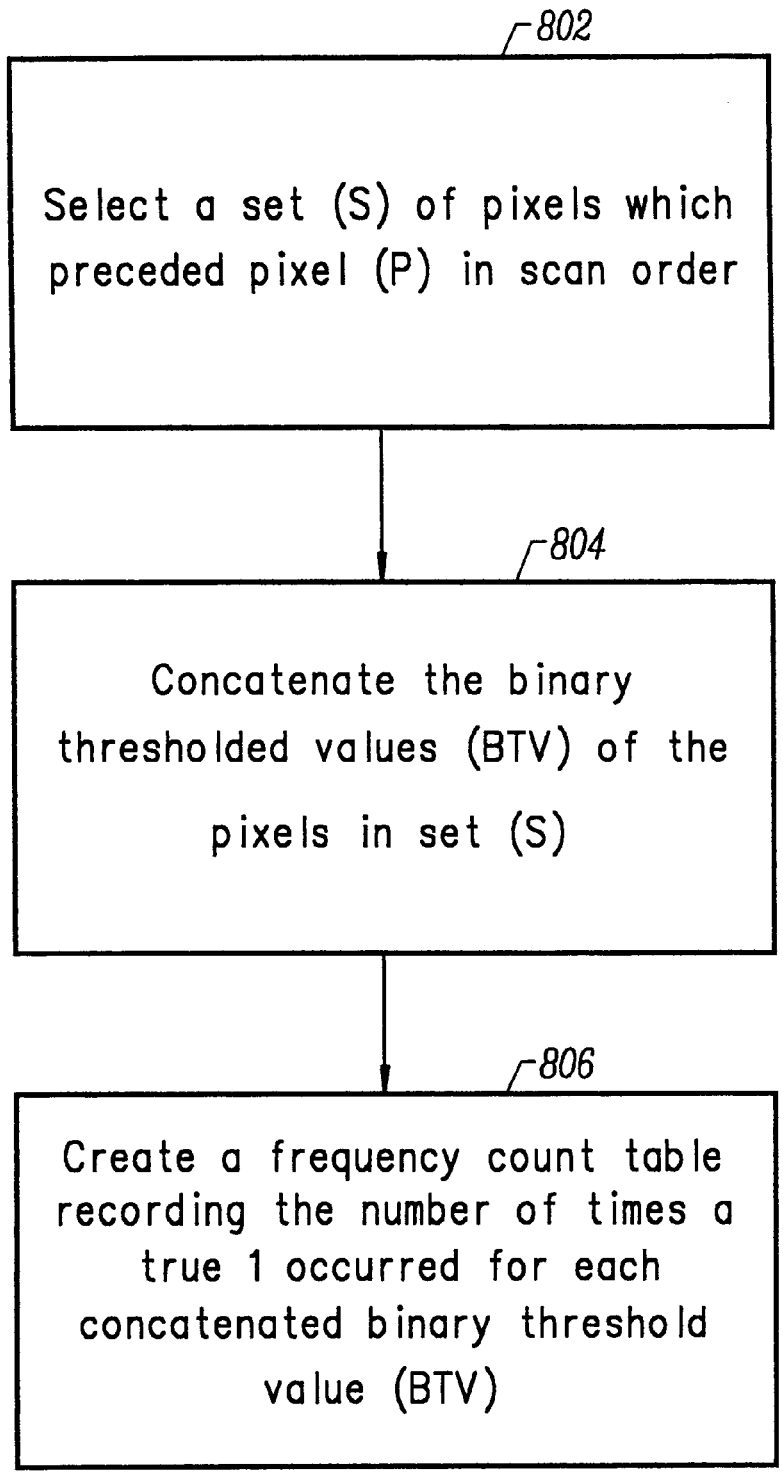
FIG. 7 is a flow diagram demonstrating the context method.

A second scheme used in some embodiments of the invention is a variation of the JBIG scheme described above. Referring to FIG. 7, the pixels in S or a similar set are utilized (802). The binary thresholded values (BTV) are concatenated to provide a binary number which is then used as an index into a table of frequency counts (804). The estimated probability table is compiled from each previous occurrence of the index (context) (806). This method is referred to as the context method. Hence, if the context is from 4 pixels, a table such as in FIG. 3 is maintained and utilized to retain statistics of $prob_1$ or $prob_0$ in the context/JBIG scheme.

Referring to the table, the probability that the next bit after 1011 would be a one (1) is examined by looking to the appropriate location of the table at 1011 signified by 300. Thus, the table indicates that 4/10 or 4 out of the last 10 times, the next bit was a one (1). Similarly, the probability that the next bit after 1101 would be a 1 is examined by looking to the appropriate location of the table at 1101. Thus, the table indicates that 8/13 or 8 out of the last 13 times, the next bit was a one (1). The table may also contain approximations rather than exact values. After each pixel is encoded, the table is updated to record the appropriate statistics.

Switching Method

The generation of a context (e.g., a diff value or a JBIG-type context) and assigning of a probability to the context is the modeling portion of the compression. Thus, the inverse scheme and context scheme comprise the modeling portion of an embodiment of the invention. If the probabilities are accurate and close to one (1), high compression is achieved. In other words, the more accurate the probabilities are and closer to one (1) (or 10 out of 10 times; or 7/7 times . . . ), the higher the compression.

In some embodiments, an entropy encoder may update the prediction and probability data in a feedback arrangement. Modeling may thus be performed during the encoding process by an adaptive encoder. For example, if a certain context and bit value are occurring with greater frequency, the estimated probability for that context may be adjusted upwards if the prediction matches the actual bit value, or downwards if the prediction does not match the actual bit value.

The portion of compression which involves conversion of the prediction, the estimated probability, and the actual bit value into encoded bits is called entropy encoding. Entropy is a term of art which means or is a measure of how much information is encoded in a symbol. Thus, the higher the entropy of a message, the more information it contains. In this respect, if one uses entropy encoding, bits of data may be encoded using a number of bits corresponding to their information content. Very predictable bits have a lower entropy, so require fewer bits to encode.

As the probability of a certain bit increases, the compression obtained using entropy encoding increases. Thus, the objective is to use a scheme which results in the highest probability for each pixel. Therefore, the best possible entropy encoding would use the highest probability as obtained from various different schemes (e.g., the inverse scheme, the JBIG scheme, etc.). The switching method of the present invention allows for bit-level selective switching from scheme to scheme to utilize the highest probability.

The information regarding the pixels prior to P[i][j] (and the threshold array) is referred to as the context:

$$P[i][j] = \begin{cases} \text{prediction} = 1, \text{ with estimated probability} = prob_1 \\ \text{prediction} = 0, \text{ with estimated probability} = 1 - prob_1 = prob_0 \end{cases}$$

In this respect, the probability that P[i][j] is equal to one (1) is $prob_1$ and the probability that P[i][j] is equal to zero (0) is $prob_0$. Thus, using the context scheme and referring to FIG. 3, the estimated probability, $prob_1$, that P[i][j] will have a binary value of one (1) (300) is approximately 4/10 or 0.4 and the estimated probability, $prob_0$, that P[i][j] will have a binary value of 0 is approximately:

$1 - prob_1$ or $1 - 0.4 = 0.6$ or 6/10.

Using arithmetic encoding (a type of entropy encoding), the higher the probability, the higher the compression capability. To determine the number of bits that are required to encode a set of binary numbers, the probability is used in a logarithmic calculation. More specifically, the number of bits required to encode a binary number with a known probability is:

$$\log 2 \frac{1}{prob_1} \text{ if the outcome } P[i][j] = 1 \text{ and}$$

$$\log 2 \frac{1}{1 - prob_1} \text{ if the outcome } P[i][j] = 0.$$

Thus, compression will take place according to the above statistics using arithmetic encoding.

If $prob_1$ is an accurate reflection of the true probability, the expected cost in encoding bits to encode P[i][j] is given by:

−(prob0)log 2 prob0−prob1 log 2 prob1=−(1−prob1)log 2(1−prob1)−prob1 log 2 prob1

To keep this cost low, the estimate of $prob_1$ needs to be accurate and as close to zero (0) or one (1) as possible. As the estimate of $prob_1$ moves away from 0.5, the number of bits required to encode the respective pixel bit decreases. This results due to the fact that if $prob_1$ is near zero (0) (i.e., $prob_0$ is near 1), then the number of bits required to encode that bit is close to zero (0). Similarly, if $prob_1$ is near one (1), then the number of bits required to encode that bit is also close to zero (0). Thus, the closer the probability is to zero (0) or one (1), the lower is the cost of encoding.

The probability $prob_1$ is a conditional probability, conditioned on the context used. In the embodiment described herein, two different contexts (schemes) are utilized and whichever context (scheme) results in the lowest total cost over a set of previously encoded pixels is the scheme used for encoding the current bit. In other embodiments, more than two schemes may be cost-evaluated for encoding each pixel bit.

At each previously scanned pixel, the cost to encode that pixel is computed as:

−log 2 prob1 inverse for the inverse scheme and −log 2 prob1 context for the context scheme if the pixel was a one. Similarly, −log 2 $prob_0$inverse and −log 2 $prob_0$context if the pixel was a zero, when $prob_1$ inverse and $prob_1$ context are the probability estimates from the inverse and context schemes.

The next step is to add up the cost for the set of previously encoded pixels, such as S, for each scheme. The scheme with the lower sum is used to predict P[i][j]. In other words, the scheme with the lower summed cost is utilized for the encoding. Thus, if the summed cost of the inverse scheme over the pixel set S is 140 bits and the summed cost of the context scheme over the pixel set S is 165 bits, then the inverse scheme would be utilized for the encoding. The summed cost is recalculated for each new pixel scanned in the P[i][j] array. Hence, the scheme used may be switched from pixel to pixel depending on the cost associated with each scheme.

Figure 13A:
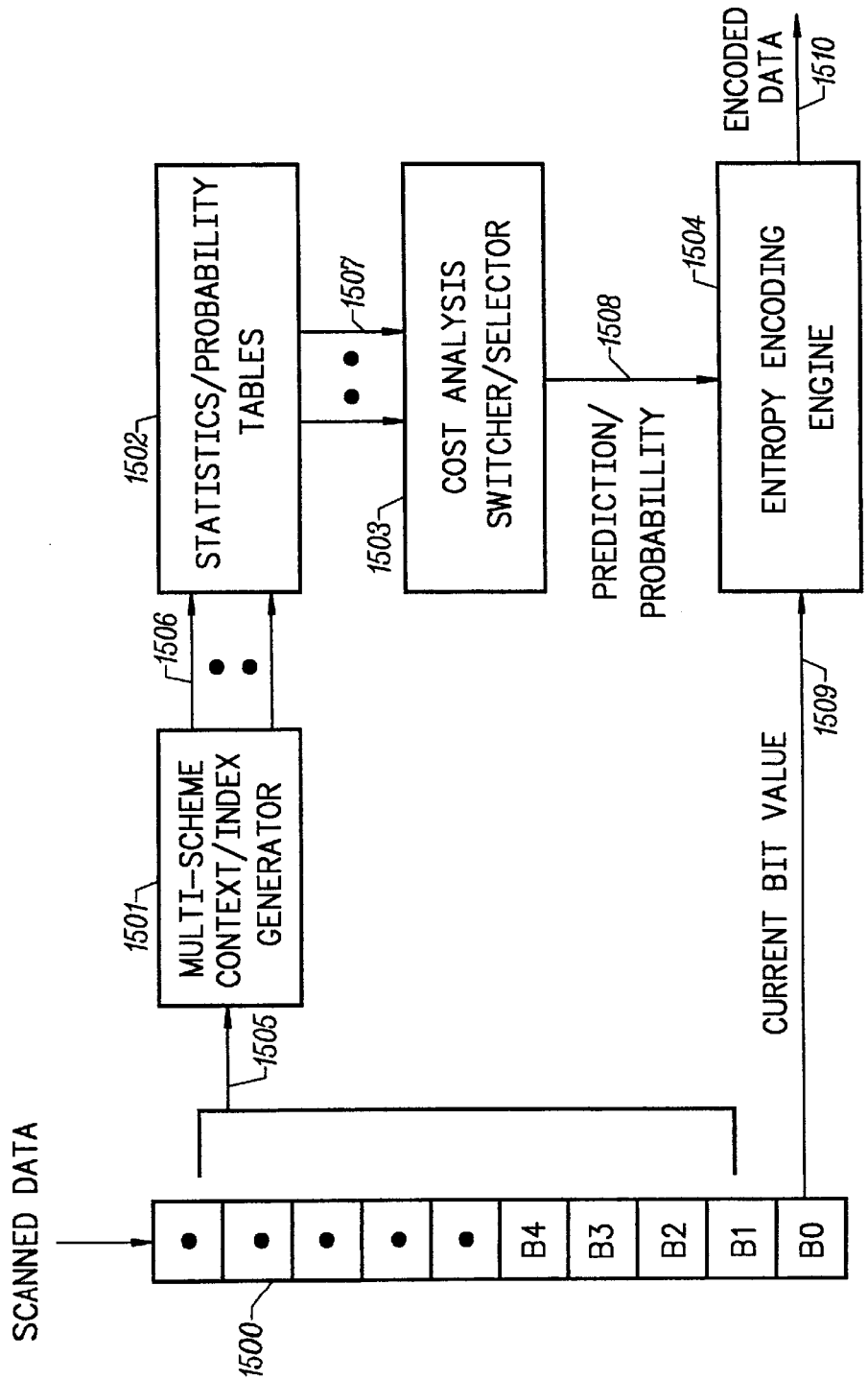
FIG. 13A is a block diagram of a switching embodiment of the invention.

FIG. 13A is a functional block diagram illustrating a switching embodiment of the invention. In FIG. 13A, scanned data is stored in registers (e.g., a shift register) or memory cells 1500 for use in encoding the data. The neighboring pixel bit values 1505 of the set S from registers 1500 are provided to the multi-scheme context/index generator 1501. Contexts or indices 1506 are generated for each scheme using methods such as those described for the inverse and JBIG schemes.

Contexts and indices (such as diff and the JBIG context) 1506 are presented to the statistics/probability tables 1502 to access the respective stored predictions and probabilities 1507 for each scheme. The prediction/probability values 1507 are provided to the cost analysis switcher/selector 1503 for determination of the current encoding scheme, based on the cost analysis described above. The prediction/probability 1508 for the selected scheme is then provided to entropy encoding engine 1504. The current pixel bit value 1509 from registers 1500 is also provided to entropy encoding engine 1504, and based on the value of prediction/probability 1508, entropy encoding engine 1504 produces encoded data 1510.

The functional blocks of FIG. 13A may be embodied in dedicated electronic hardware, or they may be embodied in software functions implemented in general electronic hardware, or they may be embodied in a combination of dedicated hardware and software functions.

Hybrid Context Method

A second embodiment of the invention utilizes multiple compression schemes to form a hybrid context for each pixel. By using a hybrid context, the embodiment is able to take advantage of the unique statistical aspects of each compression scheme in determining the probability for each possible hybrid context. The resulting hybrid context can provide improved prediction ability (i.e., higher probabilities) with correspondingly higher compression ratios.

The hybrid context is formed by assigning a portion of bits in the context to each compression scheme. The size of the total context and the apportionment of the bits between the respective schemes may vary for different embodiments. For the purpose of clarity, a specific embodiment having a two-scheme thirteen-bit context is described.

In this embodiment, the thirteen-bit context is separated into a seven-bit portion assigned to the inverse scheme, and a six-bit portion assigned to an abbreviated JBIG scheme. This apportionment is illustrated in FIG. 8. As shown, the six least significant bits (B6–B1) of the thirteen-bit context store the JBIG context information, and the seven most significant bits (D6–D0) store the inverse scheme information. Similar embodiments may have a different ordering of this context information.

Figures 11, 12:
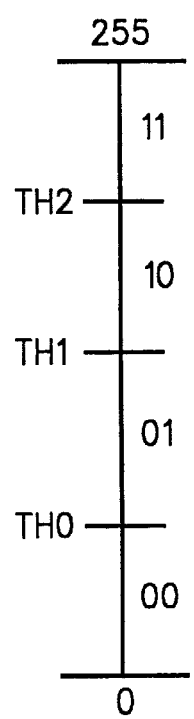
FIG. 11 is a pixel diagram illustrating nearest neighbors for a modified JBIG scheme.
FIG. 12 is a threshold diagram for a multi-bit embodiment.

The set of previous pixels S' is a reduced set from S described earlier. The set S' consists of six previous pixel values as shown in FIG. 11. B0 represents the current pixel, whereas B1–B6 represent the six nearest neighbors, with B1 being the nearest neighbor, B2 being the second nearest neighbor, etc. The values of B1–B6 provide the abbreviated JBIG context portion for the hybrid context.

With respect to the inverse scheme context portion, the "gray value" estimation is performed as described previously for the inverse scheme by progressing through the respective ranges of the previous pixel values, preferably in the order of B1, B2, B3, etc., to maintain the priority of the nearest pixels since the nearest pixels contain the highest predictive information. In other embodiments, to reduce the amount of calculation per pixel, the "gray value" range for several pixels may be precalculated by column and stored to render repeated calculation of the intersections unnecessary. The calculation reduction is achieved with some compromise in priority of the pixel information.

The resulting difference value (diff) between the gray value estimate and the current pixel threshold is typically within the range of −255 to 254, e.g., for eight-bit pixel data. To reduce this difference value into the prescribed seven bits, the difference value is remapped into the range of 0 to 127. One such mapping is illustrated in FIG. 10.

In FIG. 10, the difference value (diff) is mapped into the seven bit difference value (diff') for generation of the inverse scheme portion of the hybrid context as follows:

$$diff' = \begin{cases} 0, & \text{for } diff < -64 \\ diff + 64, & \text{for } -64 \leq diff \leq 63 \\ 127, & \text{for } diff > 63 \end{cases}$$

The above distribution for diff' assures better probability resolution for gray value estimates near the threshold value at the cost of clamping diff' for gray value estimates further away from the threshold, where the probability is less likely to vary substantially for different diff values.

With the hybrid context formed as described, statistical analysis of a set of past data may be performed to establish a probability table indexed by specific context values for use in the entropy encoding. As described previously, this may be done by tracking the number of occurrences of each particular context, and the number of times each particular context resulted in a one (1) or a zero (0). The resulting probability for a particular context to yield a one (1) for example, would then be an approximate count of times that particular context produced a one (1) divided by the overall approximate count for occurrences of that particular context. Also, as mentioned previously, an adaptive entropy encoder may update statistics during encoding to maintain probability data, or some combination of statistical analysis and adaptive encoding may be used.

FIG. 9 is a flow diagram for the encoding process using the hybrid context. In step 1100, the six-bit JBIG context is determined from six previous pixels. In step 1101, the seven-bit inverse scheme context (diff') is determined. The relative order in which steps 1100 and 1101 are performed is not critical to the operation of the embodiment. In step 1102, the two context portions are combined into a single hybrid context, and, in subsequent step 1103, the context is used as an index into the statistics table to access the prediction and estimated probability for that context. In step 1104, the prediction, estimated probability and actual current bit value are provided to an entropy encoder for encoding of the current bit.

On the decoding side, an entropy decoder will receive the encoded bit. By performing similar operations to steps 1100–1104, the hybrid context is formed and applied to the same or a similar statistics table to obtain the prediction and probability. The entropy decoder is thus able to decode the current bit value.

Figure 13B:
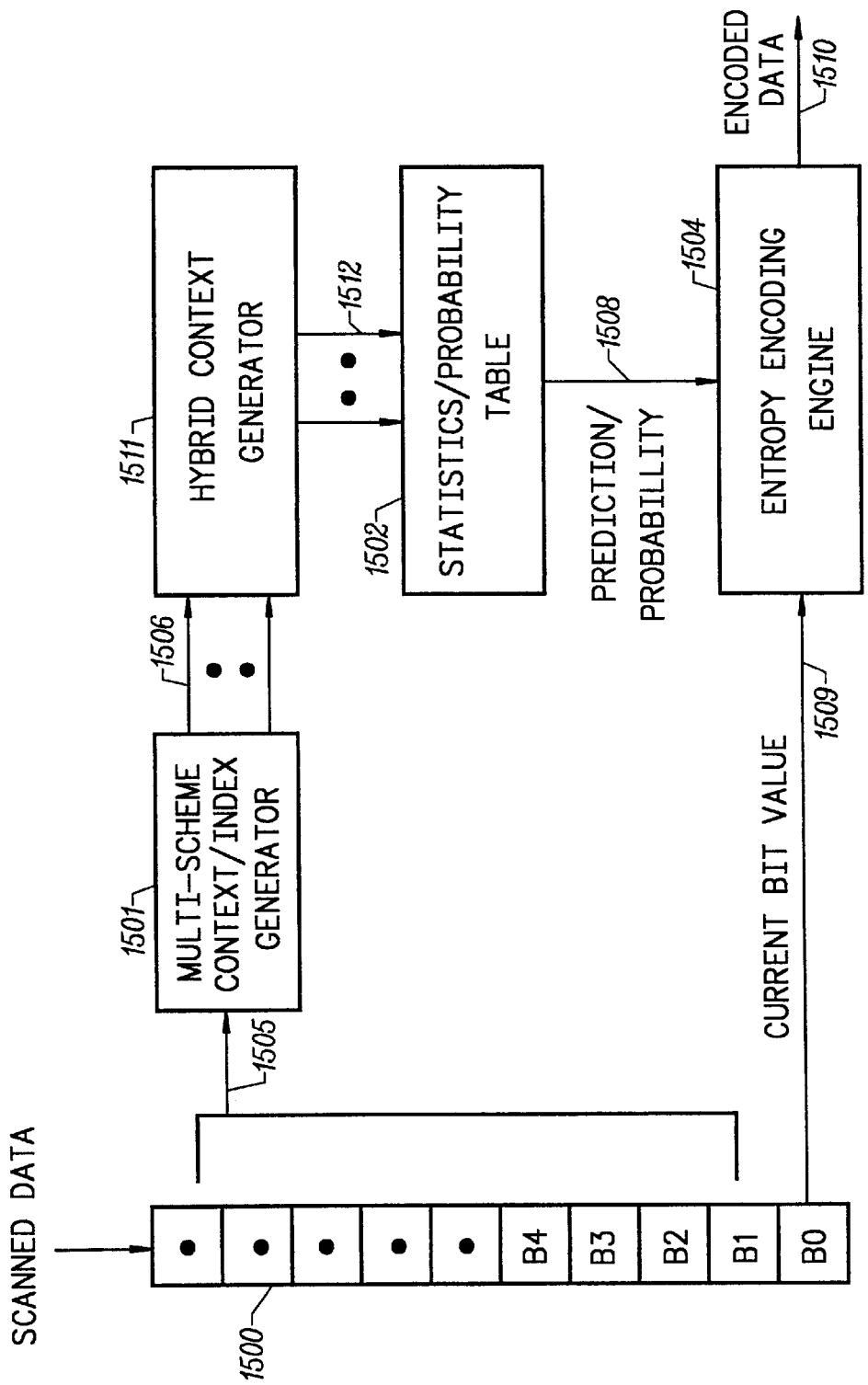
FIG. 13B is a block diagram of a hybrid context embodiment of the invention.

FIG. 13B is a functional block diagram illustrating a hybrid context embodiment of the invention. In FIG. 13B, scanned data is stored in registers (e.g., a shift register) or memory cells 1500 for use in encoding the data. The neighboring pixel bit values 1505 (e.g., from the set S or S') from registers 1500 are provided to the multi-scheme context/index generator 1501. Contexts or indices 1506 are generated for each scheme using methods such as those described for the inverse and JBIG schemes.

Contexts and indices (such as diff or diff' and the JBIG context) 1506 are provided to hybrid context generator 1511 to be combined into hybrid context 1512. Hybrid context 1512 is presented to the statistics/probability table 1502 to access the respective stored prediction and probability 1508 for the hybrid context scheme. The prediction/probability 1508 for the current hybrid context is then provided to entropy encoding engine 1504. The current pixel bit value 1509 from registers 1500 is also provided to engine 1504, and based on the value of prediction/probability 1508, engine 1504 produces encoded data 1510.

The functional blocks of FIG. 13B may be embodied in dedicated electronic hardware, or they may be embodied in software functions implemented in general electronic hardware, or they may be embodied in a combination of dedicated hardware and software functions.

Entropy/Arithmetic Encoding

The present invention permits the selective switching of compression schemes based on cost analysis, or the combining of compression schemes in a hybrid context. The objective is to represent the pixel array in fewer bits than n rows by m columns.

The encoding stage of the invention utilizes the probabilities obtained in the modeling stage to encode the bits such that they are represented in fewer bits. This is performed through entropy encoding. In an embodiment of the present invention, the method of arithmetic encoding is utilized to perform entropy encoding.

The above description has focused on the compression of image data compressed (thresholded) into one-bit data which is then further compressed by the methods of the invention. It will be obvious to those skilled in the art that the methods of the invention may be similarly applied to multi-bit data. For example, data may be thresholded as shown in FIG. 12 such that two-bit data is the result. Rather than one threshold value for each pixel, three threshold values are provided for each pixel to divide the initial pixel value range into four sections, each section represented by a two bit value (00, 01, 10, 11).

Multi-bit schemes may be encoded on a bit by bit basis. Bitwise encoding may be performed by designating bit-planes for the data, such as a most significant bit-plane and least significant bit-plane. Each bit plane is then encoded using the bi-level data schemes described above, though lesser bit-planes may take advantage of the predictive information in the more significant bits by using nearest neighbor sets including bits in adjacent bit-planes.

Magnitude code representations may be used to permit encoding of subsequent bits based on the encoding of the previously encoded bits of a pixel. For example, if the three-bit magnitude code values 000, 001, 011 and 111 are assigned to the two-bit pixel values 00, 01, 10 and 11, then the second bit need be encoded only if the most significant bit is a zero, and likewise, the least significant bit need be encoded only if the second bit is zero. Thus, multi-bit compression may be performed using the methods of the present invention.

Thus a method and apparatus for data compression has been described in conjunction with one or more specific embodiments. The invention is defined by the claims and their full scope of equivalents.

What is claimed is:

1. A method for compressing data in a computer system, the method comprising:
   generating a first context based on a first compression scheme by estimating a gray value for a pixel and determining a difference between the gray value and a current pixel threshold value;
   generating a second context based on a second compression scheme;
   forming a hybrid context comprising the first context and the second context;
   accessing statistical information indexed by the hybrid context; and
   performing entropy encoding using the statistical information.

2. The method of claim 1, wherein estimating the gray value comprises:
   determining a first value range for a first adjacent pixel;
   determining a second value range for a second adjacent pixel; and
   determining an intersection range of the first value range and the second value range.

3. The method of claim 1, wherein the difference comprises a first number of bits, and the method further comprises mapping the difference into a second number of bits smaller than the first number of bits.

4. Apparatus for compressing data in a computer system, the apparatus comprising:
   a plurality of pixel values stored in memory;
   a context generator receiving a set of pixel values from the memory, the set of pixel values comprising pixel values adjacent a current pixel value, the context generator providing a plurality of contexts associated with a plurality of compression schemes, the context generator comprising means for determining an inverse scheme difference value and means for concatenating previous pixel values;

a hybrid context generator receiving the plurality of contexts and generating a hybrid context;

a table indexed by the hybrid context, the table having statistical information; and an encoding engine receiving the current pixel value from the memory and the statistical information from the table, the encoding engine providing encoded output.

5. A computer program product comprising a computer usable medium having computer readable program code embodied therein for performing data compression operations in a computer system, the computer program product comprising:

computer readable program code configured to cause a computer to generate a first context based on a first compression scheme, the computer readable program code is configured to cause a computer to estimate a gray value for a pixel and to determine a difference between the gray value and a current pixel threshold value;

computer readable program code configured to cause a computer to generate a second context based on a second compression scheme;

computer readable program code configured to cause a computer to form a hybrid context comprising the first context and the second context;

computer readable program code configured to cause a computer to access statistical information indexed by the hybrid context; and computer readable program code configured to cause a computer to perform entropy encoding using the statistical information.

6. The computer program product of claim 5, wherein the computer readable program code configured to cause a computer to estimate a gray value comprises:

computer readable program code configured to cause a computer to determine a first value range for a first adjacent pixel;

computer readable program code configured to cause a computer to determine a second value range for a second adjacent pixel; and computer readable program code configured to cause a computer to determine an intersection range of the first value range and the second value range.

7. The computer program product of claim 6, wherein the difference comprises a first number of bits, the computer readable program code configured to cause a computer to generate a first context further comprising computer readable program code configured to cause a computer to map the difference into a second number of bits smaller than the first number of bits.

* * * * *